(12) United States Patent
Martineau

(10) Patent No.: US 6,869,203 B2
(45) Date of Patent: Mar. 22, 2005

(54) LED SYMBOL SIGNAL

(75) Inventor: Patrick Martineau, Montreal (CA)

(73) Assignee: Gelcore LLC, Valley View, OH (US)

( * ) Notice: Subject to any disclaimer, the term of this patent is extended or adjusted under 35 U.S.C. 154(b) by 0 days.

(21) Appl. No.: 10/122,576

(22) Filed: Apr. 15, 2002

(65) Prior Publication Data

US 2002/0149494 A1 Oct. 17, 2002

Related U.S. Application Data

(60) Provisional application No. 60/361,140, filed on Mar. 1, 2002, and provisional application No. 60/283,882, filed on Apr. 13, 2001.

(51) Int. Cl.[7] .............................. F21V 5/00; G08B 5/22
(52) U.S. Cl. .................. 362/246; 362/244; 340/815.45
(58) Field of Search ................................ 362/246, 240, 362/244, 248, 331, 333, 800, 812; 340/815.45, 815.55, 907, 908; 40/541, 557

(56) References Cited

U.S. PATENT DOCUMENTS 3,678,458 A * 7/1972 Ljungkull et al. ............ 40/453
5,687,500 A * 11/1997 Lamparter .................. 362/240

* cited by examiner

Primary Examiner—Sandra O'Shea
Assistant Examiner—Bao Q Truong
(74) Attorney, Agent, or Firm—Orum & Roth

(57) ABSTRACT

A LED symbol signal with LEDs arrayed to correspond to a desired symbol. Light from the LEDs is directed onto corresponding optical segments of a multiple collimating zone element and directed into a forward direction/distribution. A mask defines the desired symbol. The optical segments and or a diffusion surface on the cover or multiple collimating zone element(s) diffuses the display aspect, obscuring the individual LEDs. A diameter of the optical features of the diffusion surface is smaller than a diameter of the optical segments. The LED symbol signal may be configured for retrofitting into an incandescent lamp signal housing.

32 Claims, 18 Drawing Sheets

LED SYMBOL SIGNAL

This application claims the benefit of U.S. Provisional Application No. 60/283,882, filed Apr. 13, 2001 and U.S. Provisional Application No. 60/361,140, filed Mar. 1, 2002, both applications hereby incorporated by reference in their entirety.

BACKGROUND OF THE INVENTION

1. Field of the Invention

The present invention relates to light emitting diode (LED) signals, specifically to an LED symbol signal with a uniform display aspect despite having a reduced number of LEDs.

2. Description of Related Art

Symbol signals, for example turn signals, pedestrian signals, and walk/don't walk signals previously have been designed with incandescent point light sources in a housing with a mask covering. The mask defining the symbol desired. Incandescent bulbs suffer from drawbacks of high power consumption and the requirement for frequent maintenance as the bulbs burn out.

LED symbol signals have reduced maintenance and operating costs due to the extreme life span of LEDs and their low power consumption in comparison to incandescent bulbs. Previously, LEDs were used to form the symbol desired by filling the symbol space with a full matrix of LEDs. As new, improved generations of LEDs become available, they emit more light from each individual LED. Therefore, the full matrix of LEDs is not required to create a suitably bright signal. The LEDs may then be spaced further apart from each other, omitting LEDs thereby saving material costs and lowering the signals operating power consumption. However, as the LEDs spacing increases, an undesirable "pixel effect" appears in which the individual LEDs become increasingly discernable to the viewer.

An object of the present invention is to provide a high efficiency and cost effective LED symbol with a reduced or eliminated "pixel effect". A further object of this invention is to provide a LED symbol signal with a design that may be easily modified as new generations of LEDs with increased light output become available, reducing the number of LEDs required to achieve a similar light output level.

SUMMARY OF THE INVENTION

A LED symbol signal with LEDs arrayed to correspond to a desired symbol. Light from the LEDs is directed onto corresponding optical segments of a multiple collimating zone element and directed into a forward direction/distribution. A mask defines the desired symbol. The optical segments and or a diffusion surface on the cover or multiple collimating zone element(s) diffuses the display aspect, obscuring the individual LEDs. A diameter of the optical features of the diffusion surface is smaller than a diameter of the optical segments. The LED symbol signal may be configured for retrofitting into an incandescent lamp signal housing.

Key to Figure Elements
1-Cover
2-Mask
3-MCZE
4-Housing
5-PCB
6-Nut
7-Lock washer
8-LED(s)
9-Electrical components
10-Power connection
11-Post
12-PCB screw
13-Power supply wires
14-Screw
15-Electrical connection cover
16-Electrical connection screw
17-Incandescent socket power connector
18-Optical segment
19-Diffusion pattern 20-LED light emission pattern
21-O-ring
22-Bulk PCB panel
23-Reflector

DETAILED DESCRIPTION

LED signals are disclosed in detail in U.S. patent application Ser. No. 09/756,670, filed Jan. 9, 2001 and further in U.S. patent application Ser. No. 09/827,429, filed Apr. 6, 2001, both applications assigned to Applicant, GELcore LLC, and hereby incorporated by reference in their entirety.

Figure 1A:
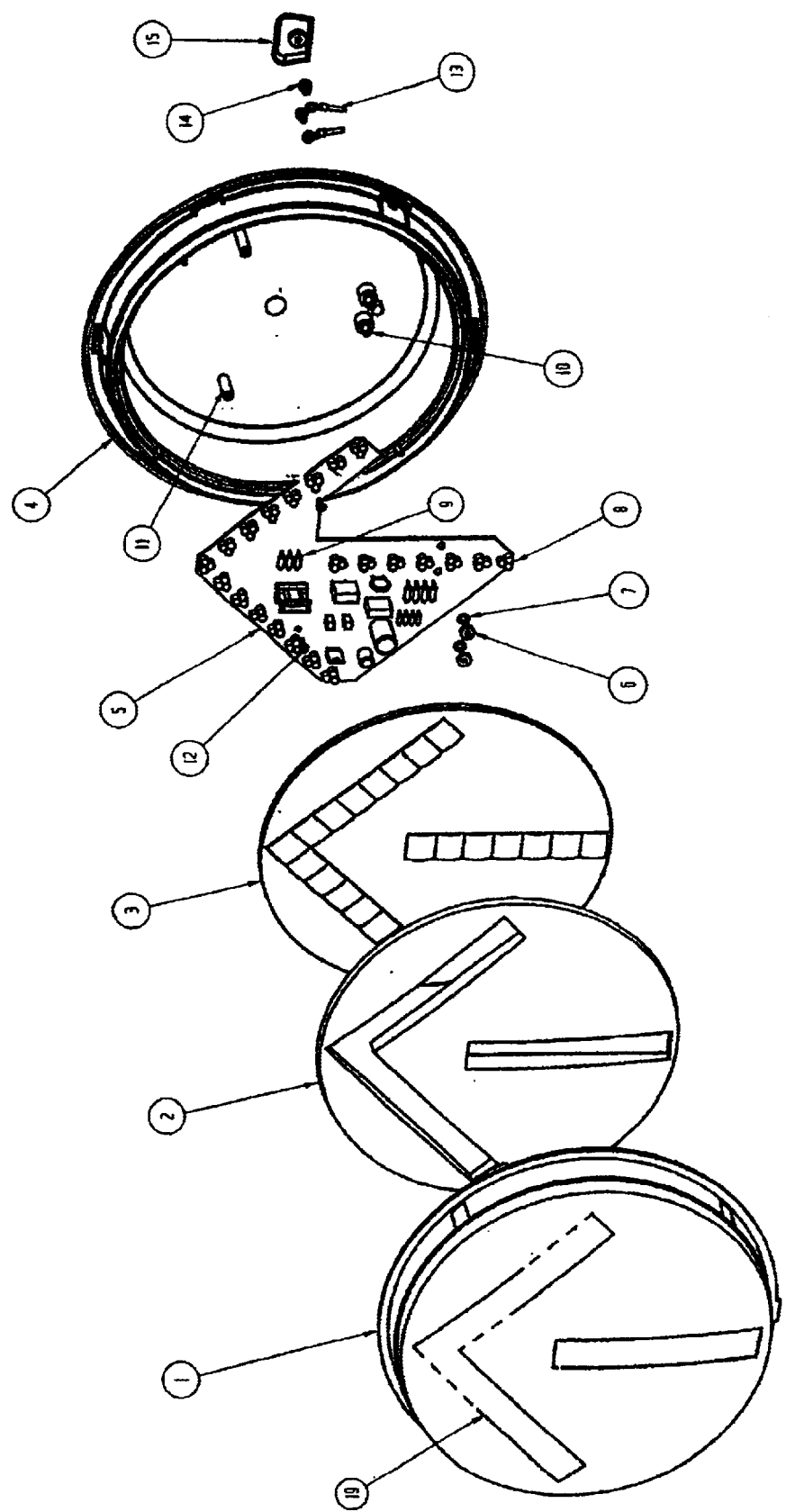
FIG. 1A is an isometric exploded view of a thick mask embodiment of the invention.
Figure 7:
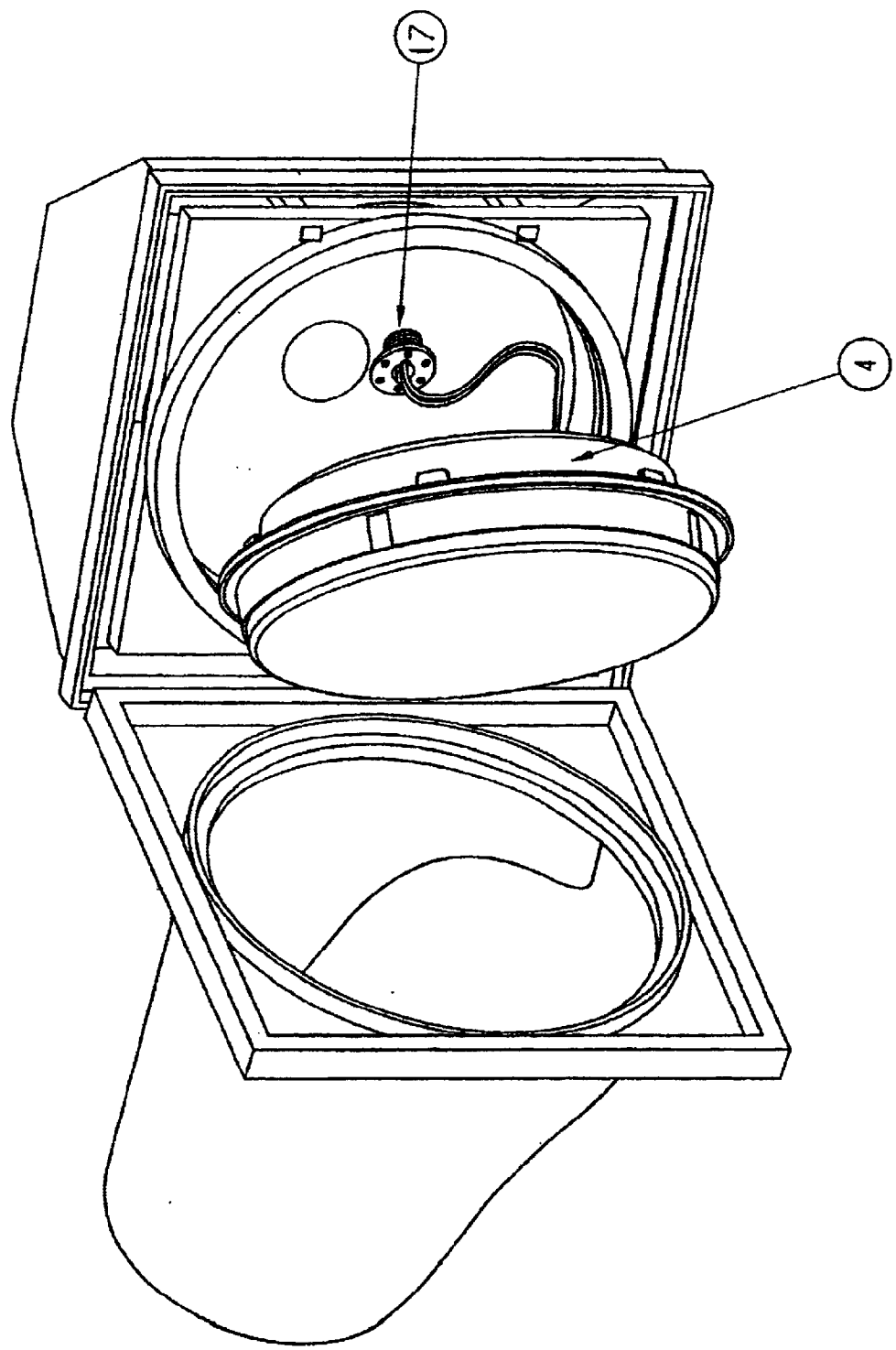
FIG. 7 is a perspective view of the invention inserted in an incandescent signal with the incandescent bulb and lens removed.

One embodiment of the present invention is shown in FIG. 1A. A printed circuit board (PCB) 5 includes power supply circuitry and LEDs 8 grouped in clusters of at least one LED 8 each, arranged in the form of a desired symbol, here a directional arrow. The PCB 5 is mounted in a housing 4 with integral power connection 10. As shown in FIG. 7, the housing 4 may be dimensioned to permit retrofitting of the invention into existing incandescent light signal housings upon removal of the original incandescent light bulb and lens(es). Power connection to existing signal housings may be via an incandescent socket power connector 17. Use of the socket power connector 17 removes the need for electricians to be involved in signal retrofitting activities. Mounted in/on the housing 4 spaced away from the PCB 5 is an optical element in the form of a multiple collimating zone element (MCZE) 3. Portions of the MCZE 3, not desired as part of the symbol are covered by a mask 2. The housing is closed by a cover 1.

Figure 2A:
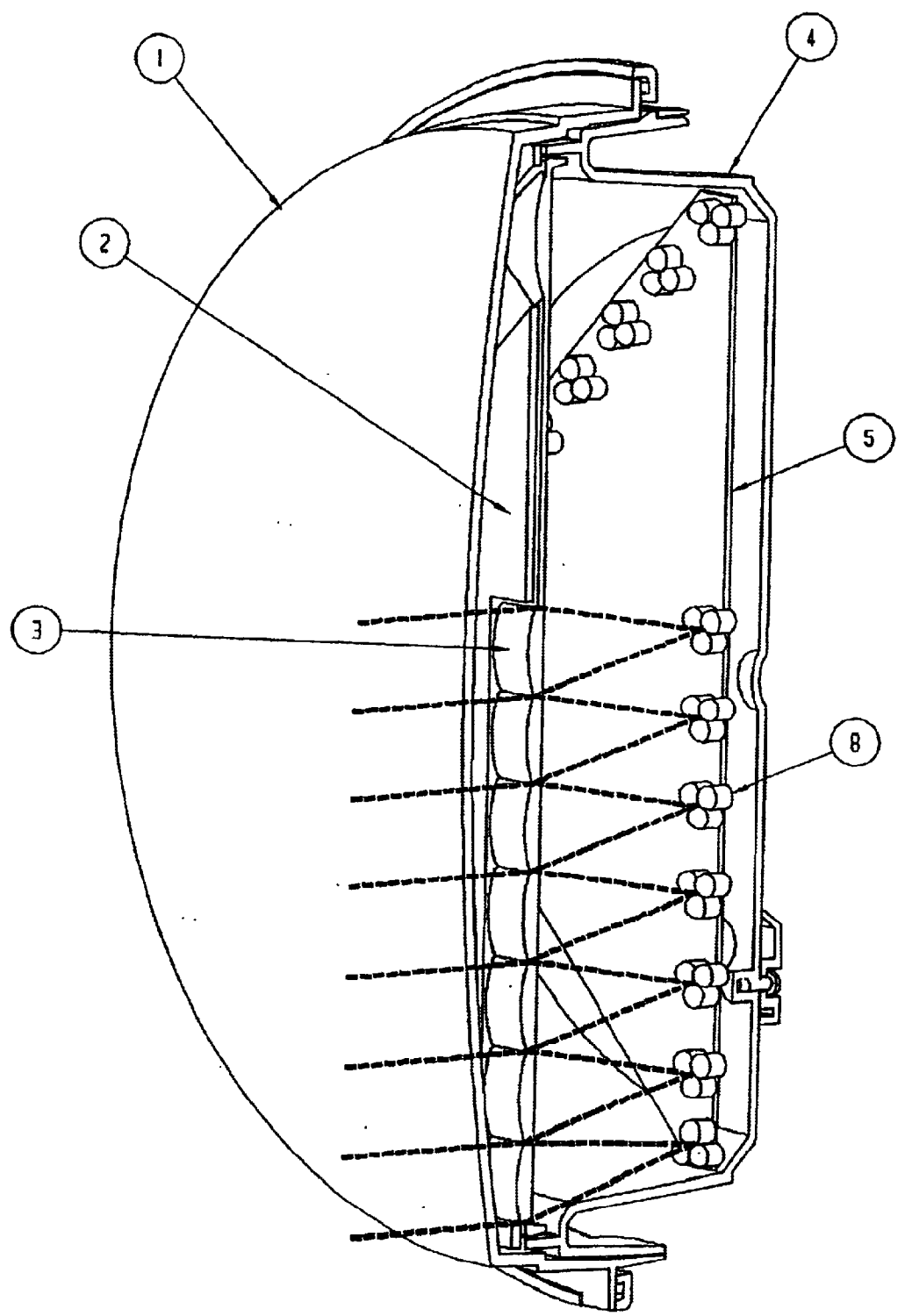
FIG. 2A is an isometric cut-away side view of a thin mask embodiment of the invention, showing light paths through the optical elements (electrical components omitted for clarity).
Figure 4A:
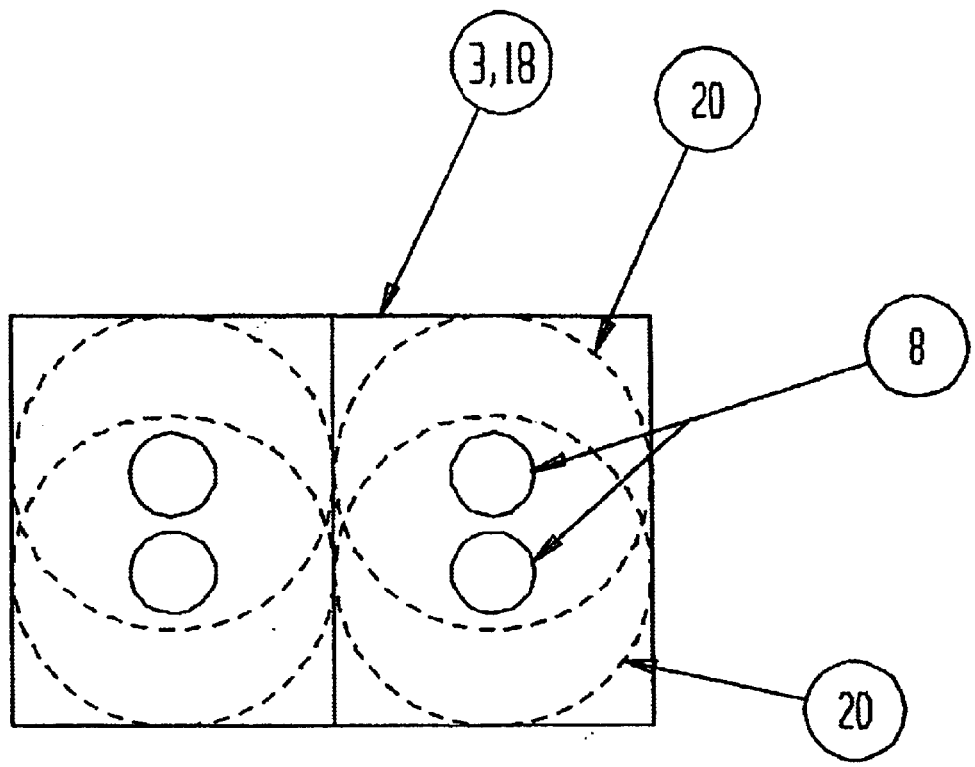
FIG. 4A is a schematic view of optical segments showing LED light distribution falling within the associated optical segments.
Figure 4B:
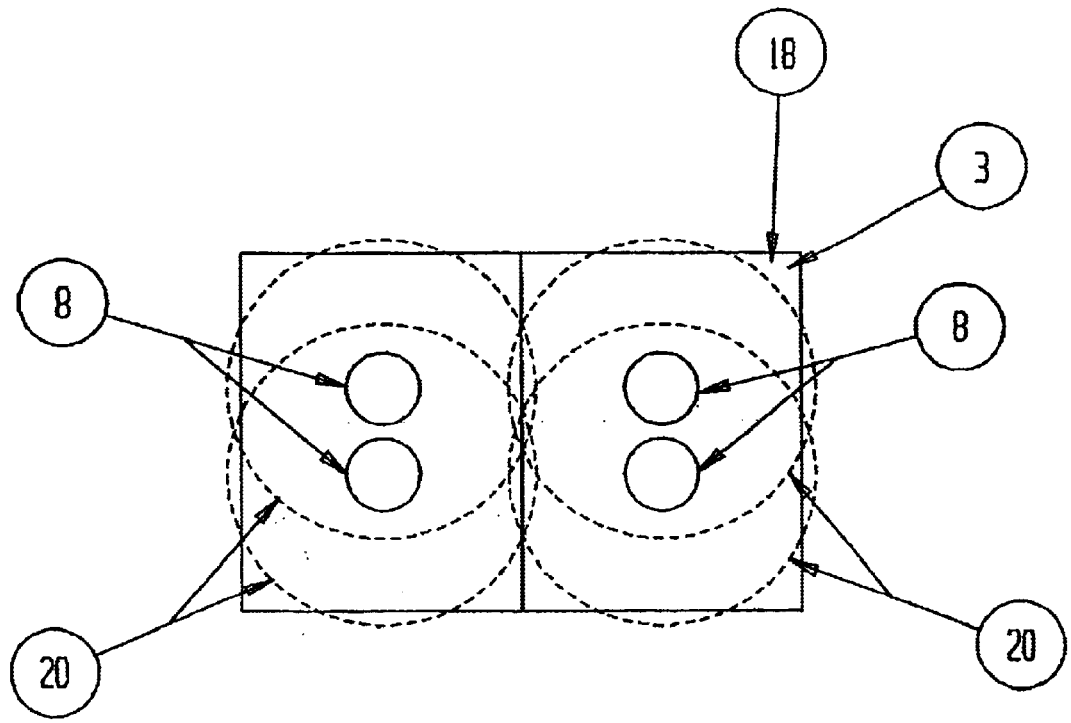
FIG. 4B is a schematic view of optical segments showing LED light distribution falling outside the associated optical segments.
Figure 5A:
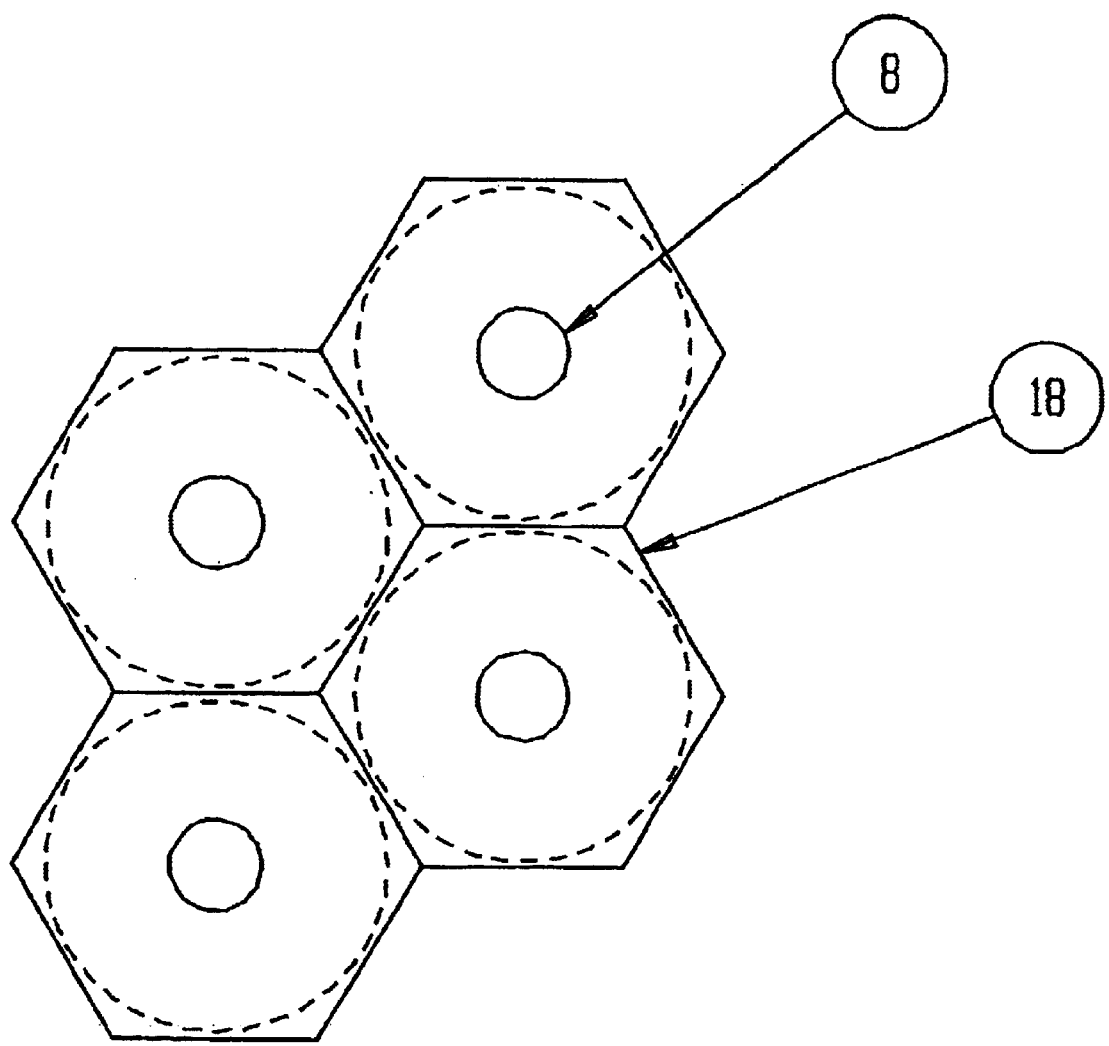
FIG. 5A is a schematic view of hexagonal optical segments.
Figure 5B:
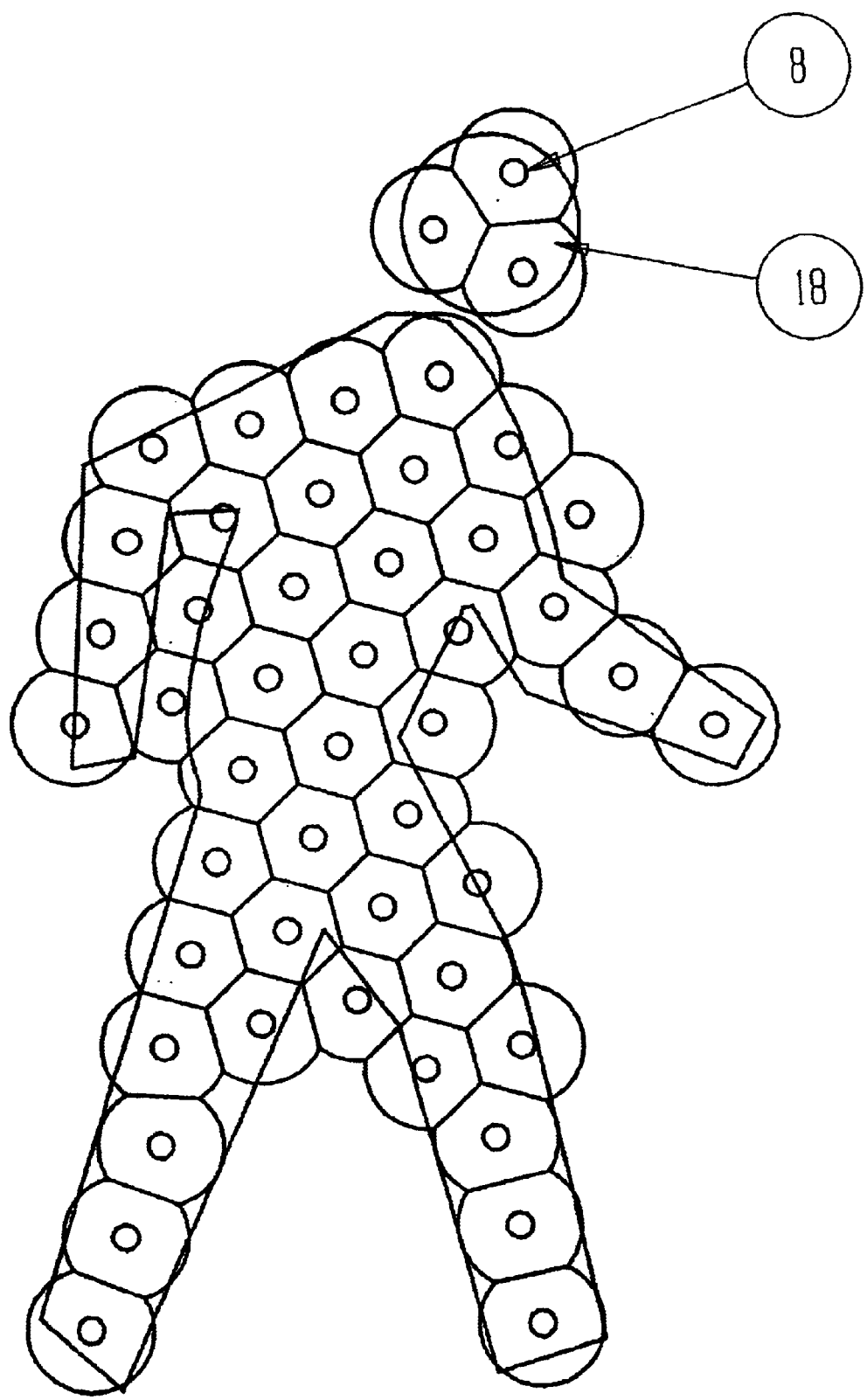
FIG. 5B is a schematic view of a human figure composed of hexagonal optical segments.
Figure 8:
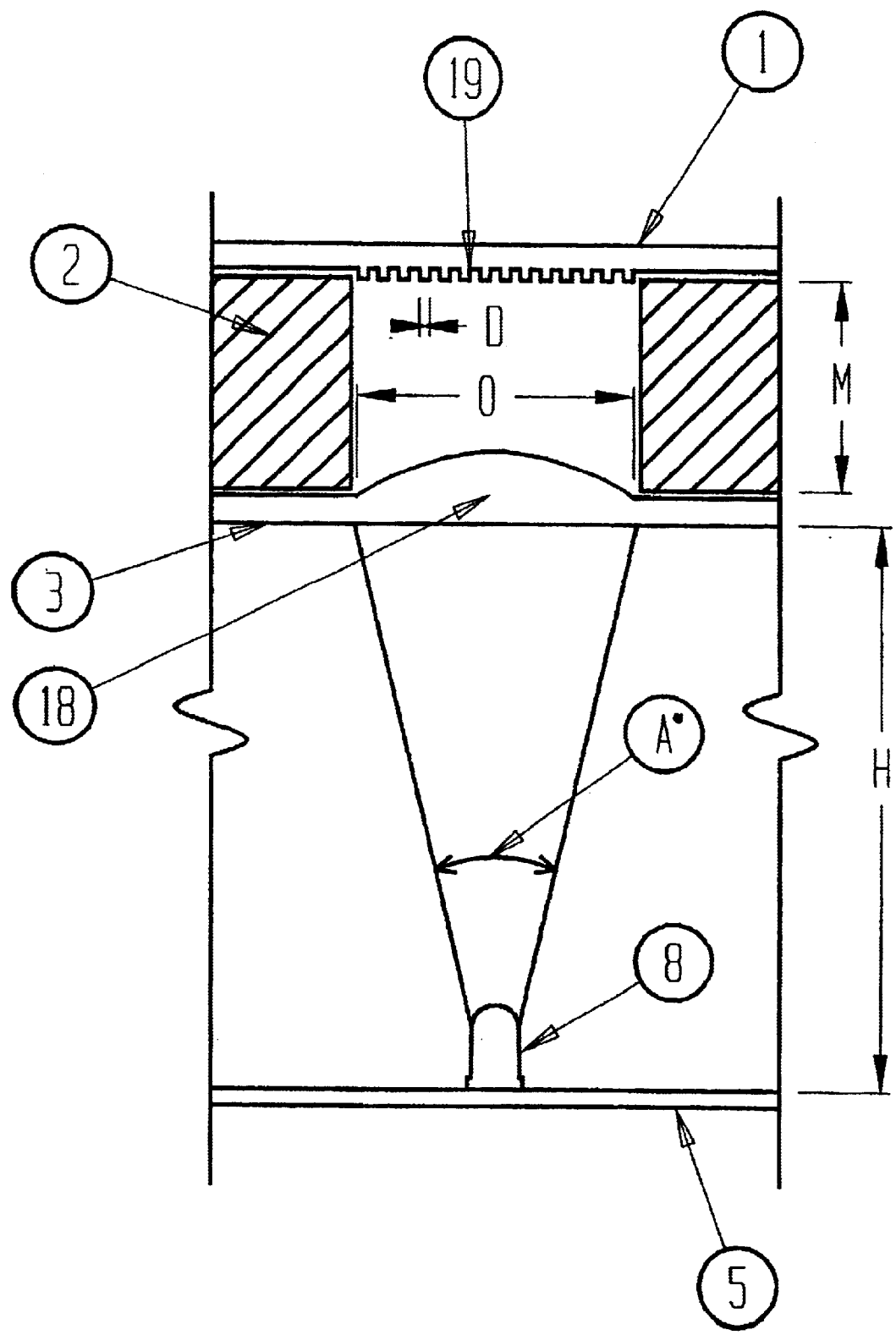
FIG. 8 is a partial side view of one embodiment of the invention showing the dimensional relationships of the invention elements.

MCZE 3 has optical segments 18 (collimating zones) matching the distribution of the LED 8 and/or LED 8 clusters on the PCB 5. As shown in FIG. 2A, each optical segment 18 collimates the light emitted from its respective LED 8 or LED 8 cluster. Also, each optical segment 18 may spread the light output into a desired distribution pattern. The effect of the MCZE 3 being to collect light from multiple point sources, each LED 8 cluster, and distribute it evenly so that the pixel effect of the individual LEDs 8 is minimized or removed from the display aspect observed by a viewer. As shown in FIG. 4A, it is preferred that rather than overlapping with a neighboring segment as shown in FIG. 4B, that the light pattern 20 from each LED/LED cluster fall within a single optical segment 18. As shown in FIG. 8, tuning of the LED light emission pattern 20 to fall within an optical segment 18 is achieved by combining the LED 8 light spread angle A°, the optical segment 18 diameter O and the distance H between the PCB 5 and the MCZE 3. For large symbol areas, for example in a walk/don't walk symbol, the MCZE 3 optical segments 18 may be formed in a hexagonal shape, as shown in FIGS. 5A and 5B. The hexagonal shape minimizing shadows or dark areas as it approximates the circular light emission pattern 20 of the LED(s) 8. Where the optical segments 18 are on an outside edge, rather than forming the outer edge in the hexagonal form, a circular outside edge maximizes coverage.

A diffusion pattern 19 on the inner or outer surface of the MCZE 3 or on an inner or outer surface of the cover 1 may be used to further obscure discernability of individual LEDs 8 in the display aspect. The diffusion pattern may be composed of circular, rectilinear or other geometric forms. Also, the diffusion pattern 19 may be formed on the desired surface via abrasion, impact and/or sandblasting. The diffusion pattern 19 preferably has individual diffusion element diameters D in a less than 1 to 1 ratio to the diameter O of the associated optical segments 18.

Cover 1 provides an environmental seal for the signal. A flat or a large radius outer surface on cover 1 prevents dirt build-up on the MCZE 3. Sealing means, for example an o-ring 21, between the cover 1 and housing 4 seals the signal from the environment.

Mask 2 may be integrated with the MCZE 3 and/or with the cover 1. The mask 2 may be in the form of a dark or opaque material, created via insert film molding, tape, paint coating or other means for blocking the LED 8 light not passing through the optical segments 18.

Figure 2B:
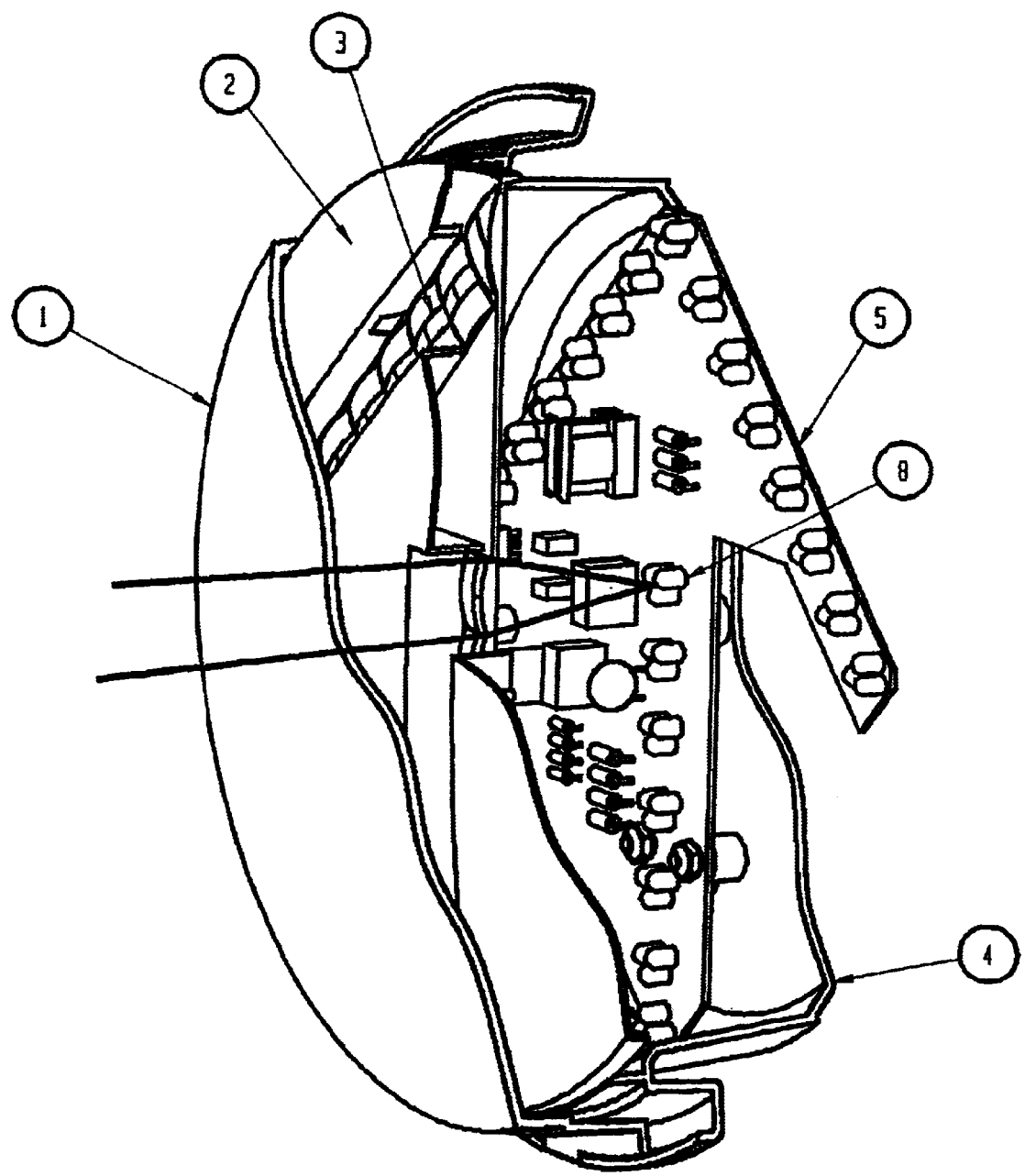
FIG. 2B is an isometric cut-away side view of a thick mask embodiment of the invention.
Figure 2C:
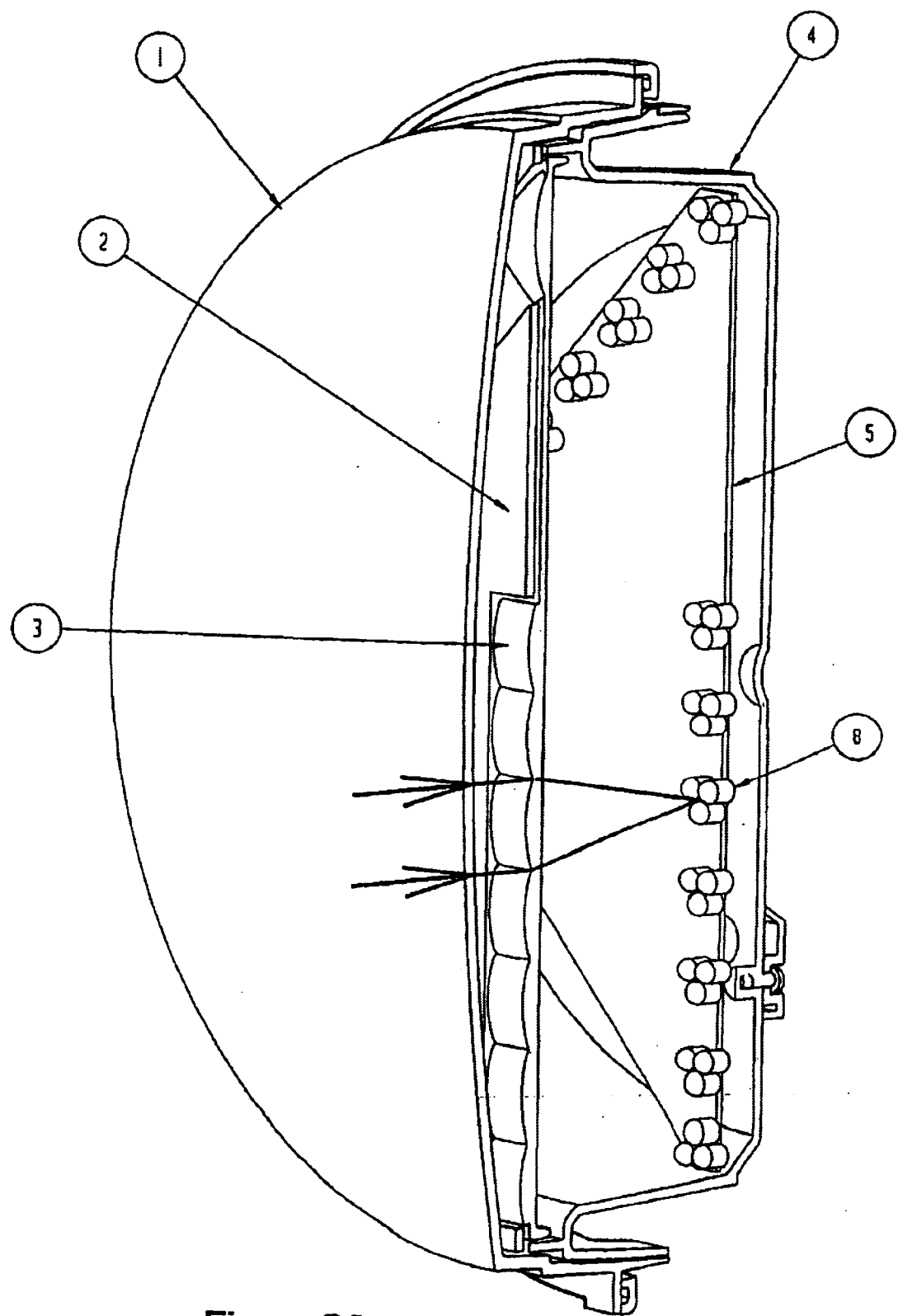
FIG. 2C is an isometric cut-away side view of a thin mask embodiment with a diffusion surface on an inner side of the cover.
Figure 2D:
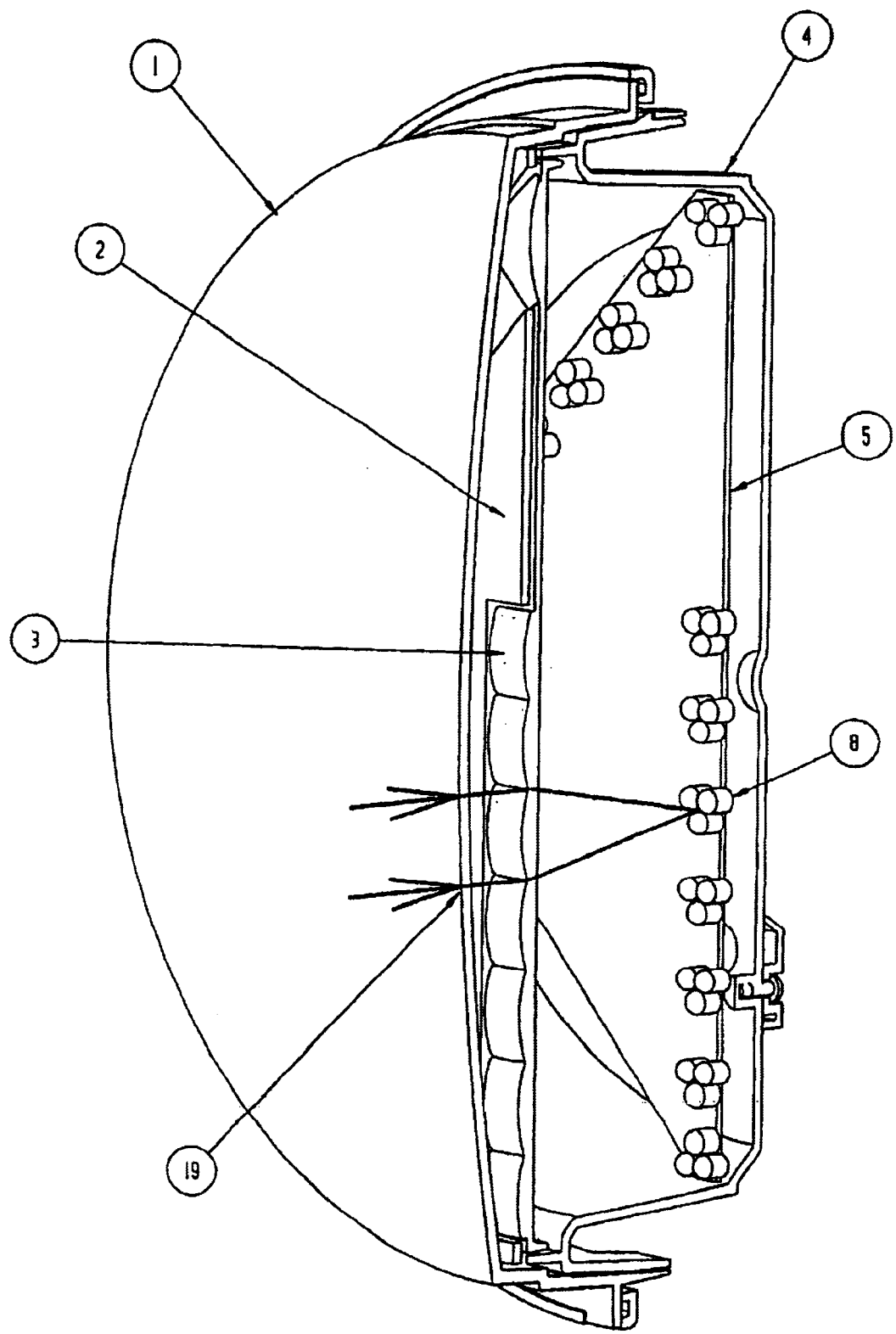
FIG. 2d is an isometric cut-away side view of a thin mask embodiment with a diffusion surface on an outer side of the cover.
Figure 2E:
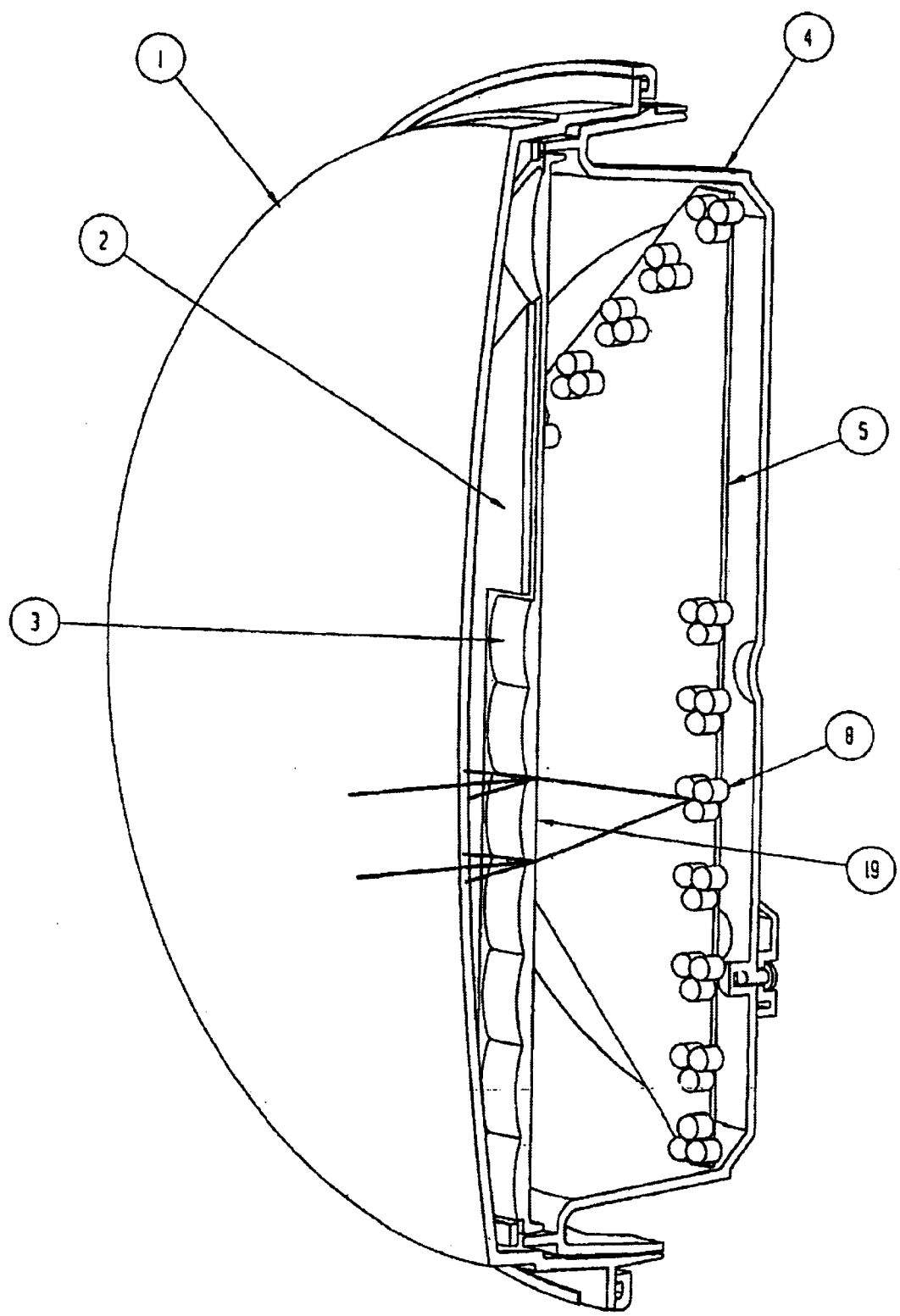
FIG. 2E is an isometric cut away side view of a thin mask embodiment with a diffusion surface on an inner side of the collimating element.
Figure 2F:
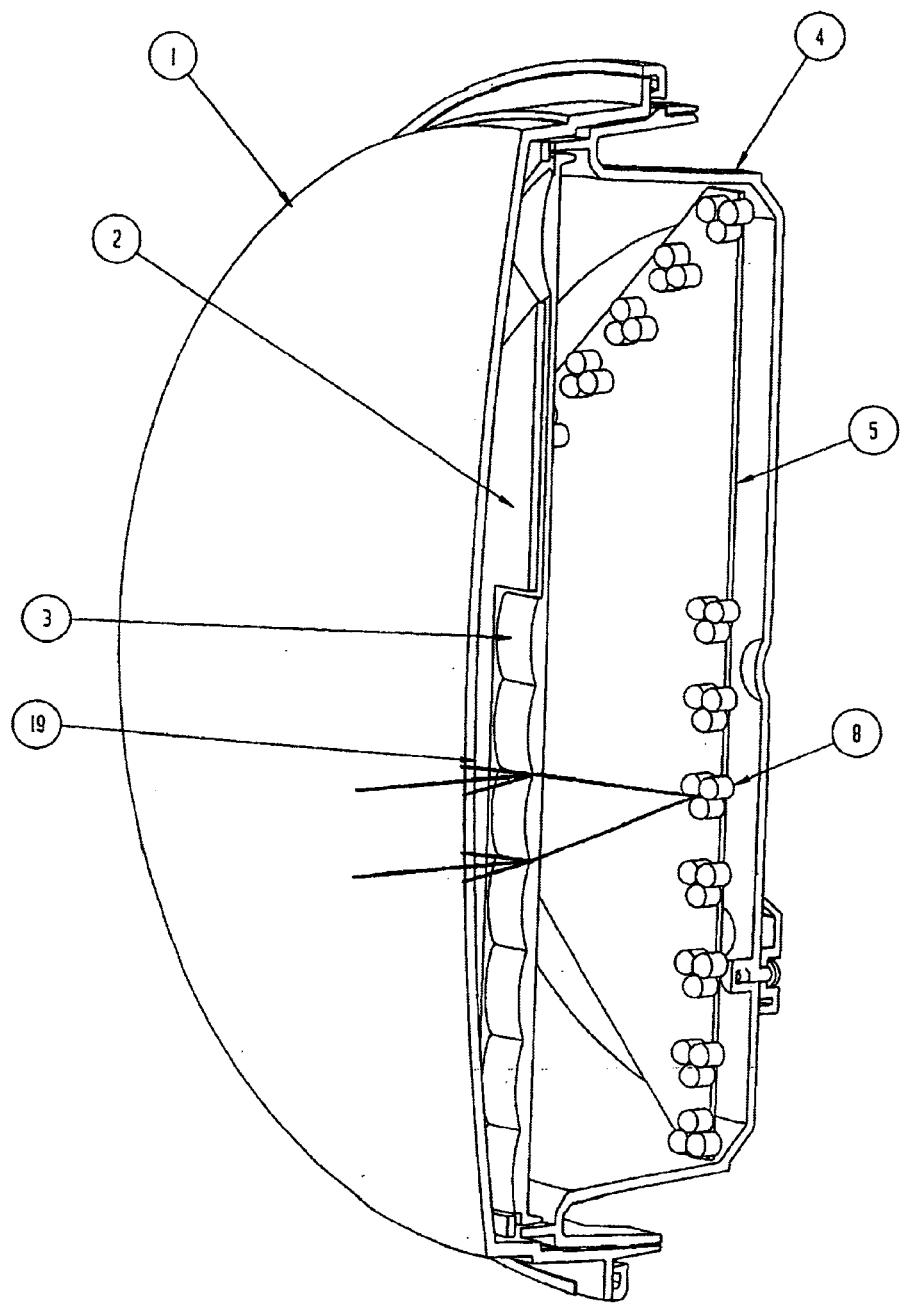
FIG. 2F is an isometric cut-away side view of a thin mask embodiment with a diffusion surface on an outer side of the collimating element.
Figure 3A:
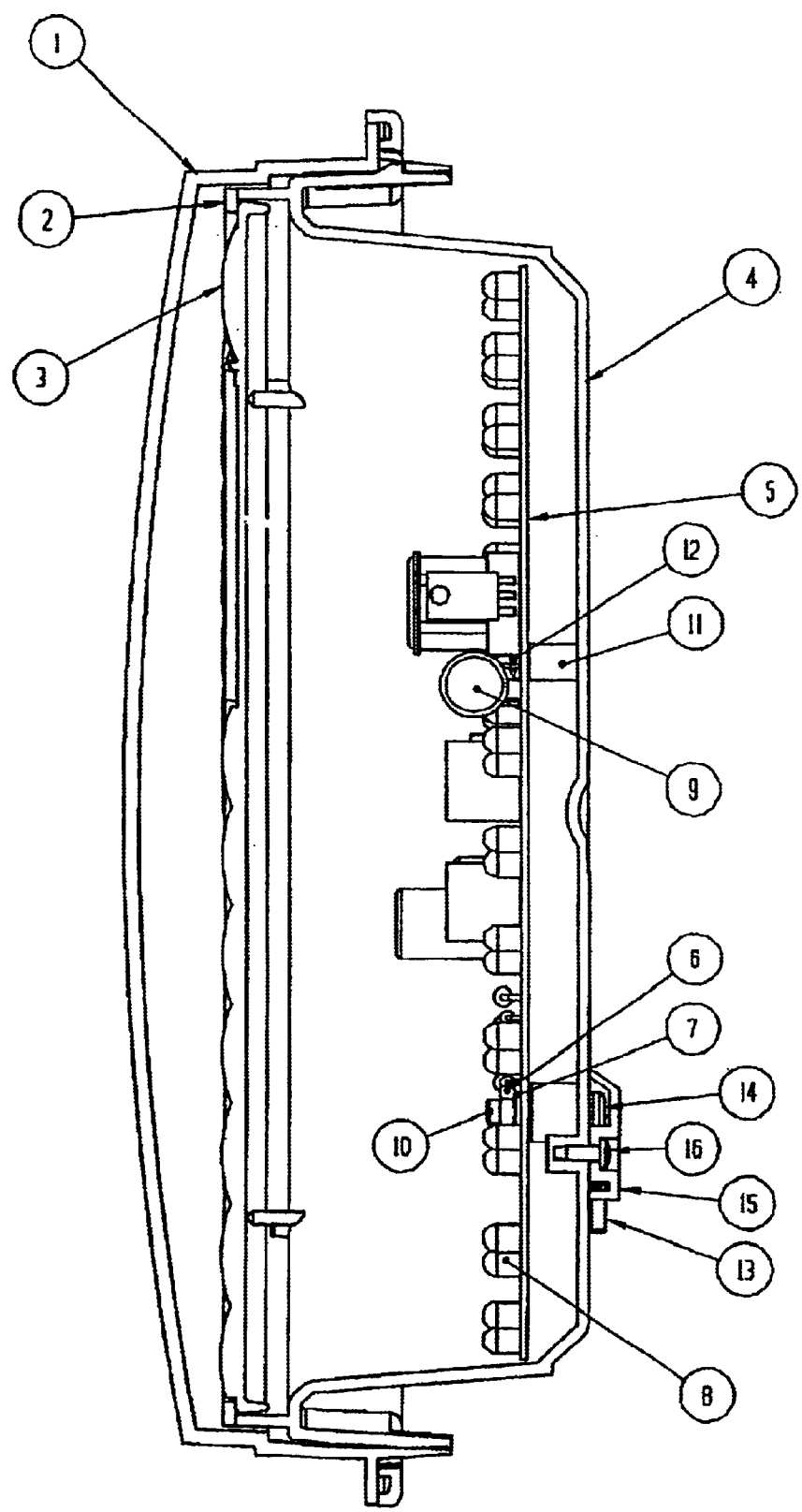
FIG. 3A is a side view of the embodiment shown in FIG. 2A, with increased component details.
Figure 3B:
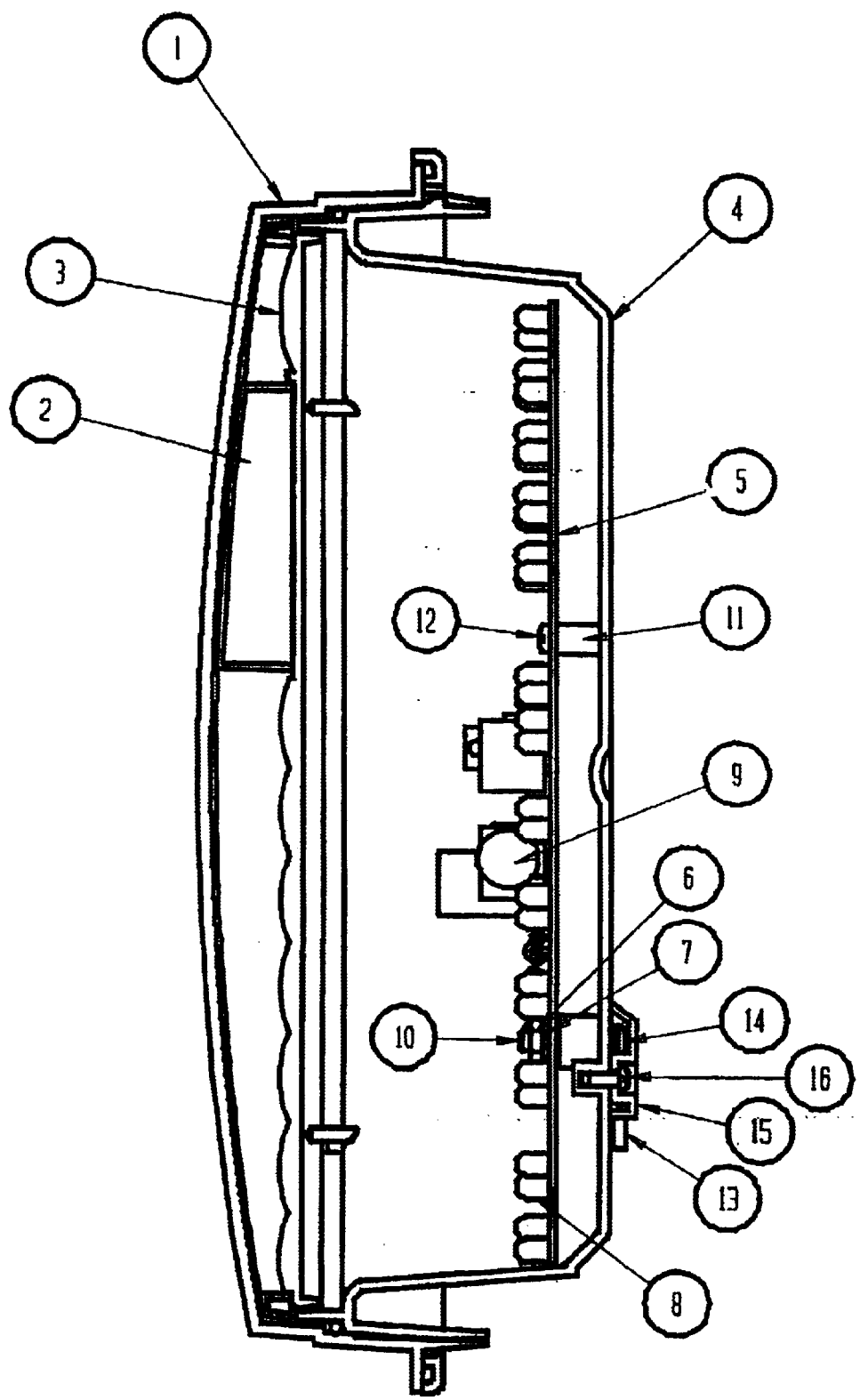
FIG. 3B is a side view of the embodiment shown in FIG. 2B, with increased component details.

To increase the symbol definition and minimize spurious light emissions, the mask 2 may be designed with a depth M that substantially fills the space between the MCZE 3 and the cover 1 (FIGS. 1A, 2B, 3B).

MCZE 3 may be a full disk or other shape dimensioned to cover the open end of the housing, with optical segments formed thereon or there may be discrete elements snap-fitting for example, into openings in the mask 2. For highest economy of materials, the cover 1, mask 2 and MCZE 3 may be integrated into a single component.

To combat sun phantom effect, the cover 1 may include an angled outer surface. Also, the diffusion pattern may be limited to only those areas in alignment within apertures in the mask 2 which define the desired symbol.

To allow directional signals to be used in any orientation, without requiring changes to the internal components, the cover 1 may be optically neutral allowing the assembled housing to be turned in any direction to orient, for example, a signal arrow as desired. A symmetrical optical design focusing the light output along the axis beam of the housing with minimal spreading allows the housing to be turned in any direction without losing the correct display aspect. An asymmetrical optical design may be used to minimize sun phantom effect and or meet Institute of Transport Engineers (ITE) specifications for the display aspect of traffic signals.

Figure 1B:
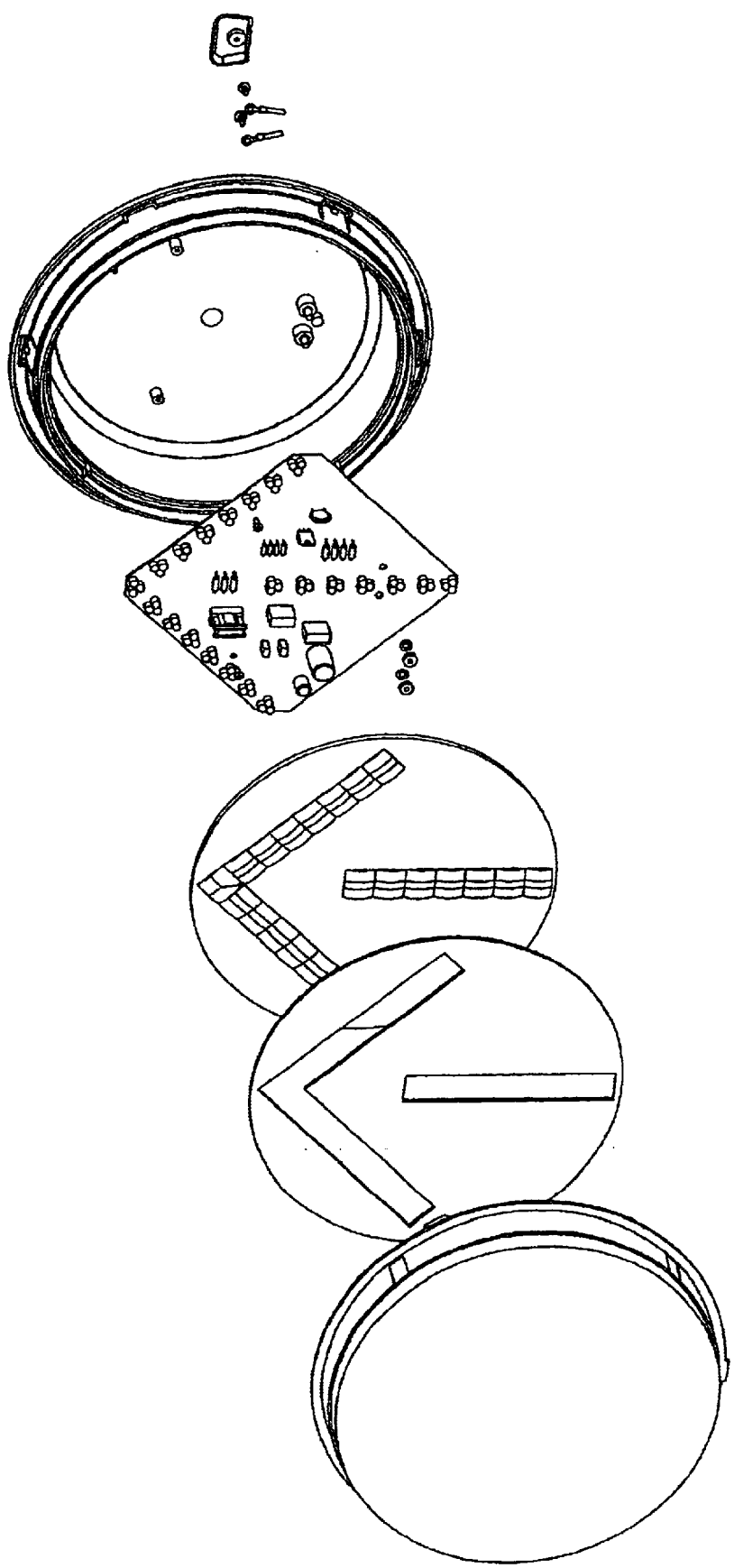
FIG. 1B is an isometric exploded view of a thin mask embodiment of the invention.

The distance H between the MCZE 3 and the PCB 5 is approximately 1 inches in a standard twelve-inch signal (FIG. 1). For designs where the symbol may be fully illuminated by a shorter distance between the LEDs 8 and MCZE 3, standoffs or shallower housings may be used. The proper distance allows the LEDs 8 to fully illuminate each optical segment 18 without creating overlap, noticeable shadows or dark areas. The resulting light beam from the signal may be changed by moving the PCB 5 with respect to existing optical components (changing H) thereby changing the light output distribution. This spacing also allows use of light degradation sensor circuitry as described in applicant Ser. No. 09/827,429 application incorporated herein.

Figure 9:
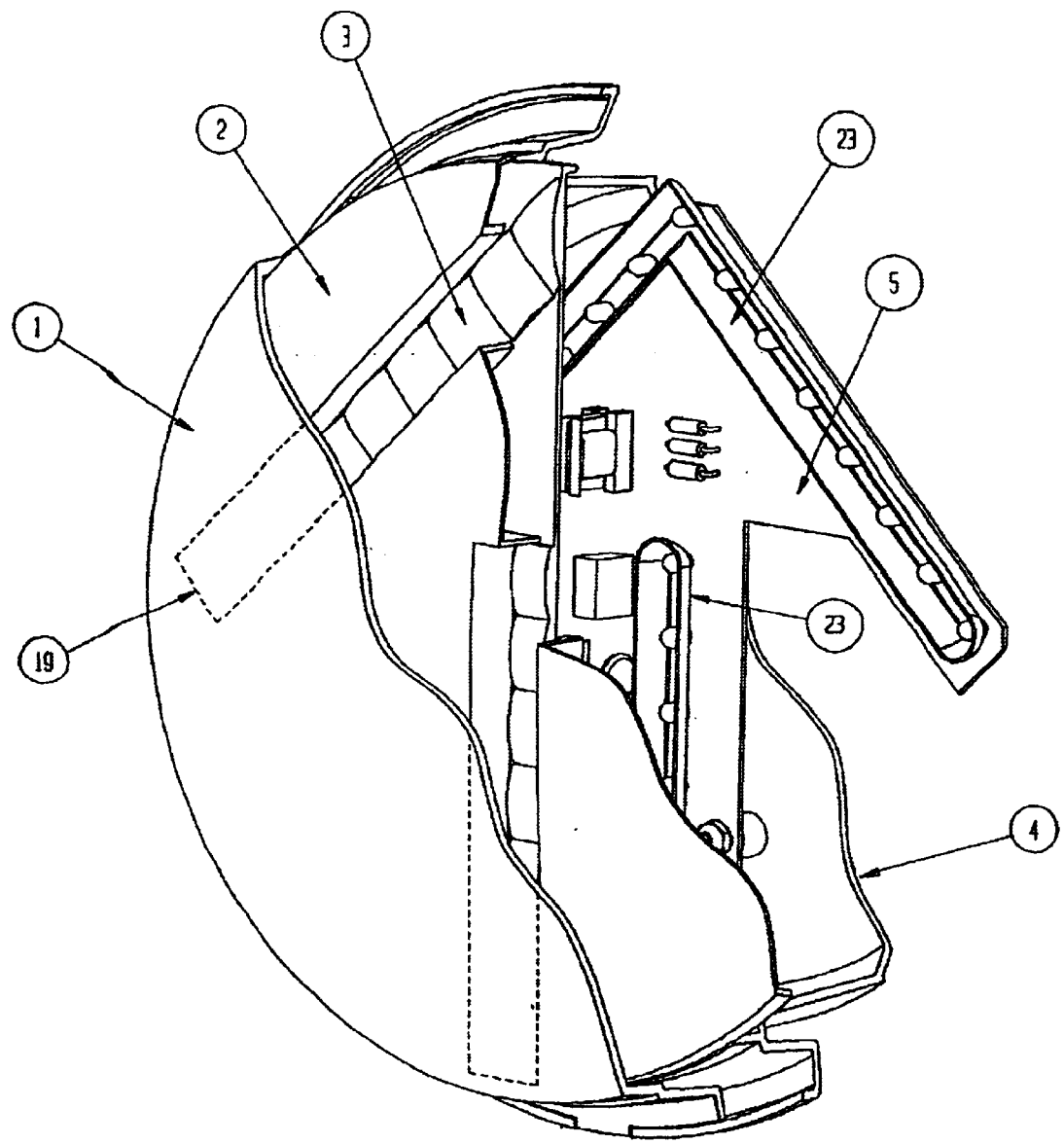
FIG. 9 is an isometric cut-away view of a thick mask embodiment of the invention using a reflector.

As shown in FIG. 9, reflectors 23 may be used to further decrease the number of LEDs 8 required to create a desired LED signal light output level. The reflector 23, lowers the amount of light emitted outside of the intended light emission pattern 20 by redirecting light normally escaping through the side of an LED 8. The reflector may also be configured to redirect light which reflects under total internal reflection conditions within the LED housing. A second reflection surface of the reflector may be aligned with the increased exit angle of the total internal reflection light component. Because the angle is higher than that of light escaping sideways from the LED housing, the second reflector surface appears as a step back in the first reflection surface and does not degrade the first surface's ability to redirect the sideways escaping light component. The extra materials cost of the reflector 23 is recouped be the lowered number of LEDs 8 required and the lower operating costs due to reduced energy consumption. The reflector(s) may be configured around individual LEDs or clusters of LEDs. A channel shaped reflector 23 allows a limited cross-over of the light emitted between nearby LEDs, lessening the change to the display aspect if one or more of the individual LEDs fails.

Figure 6A:
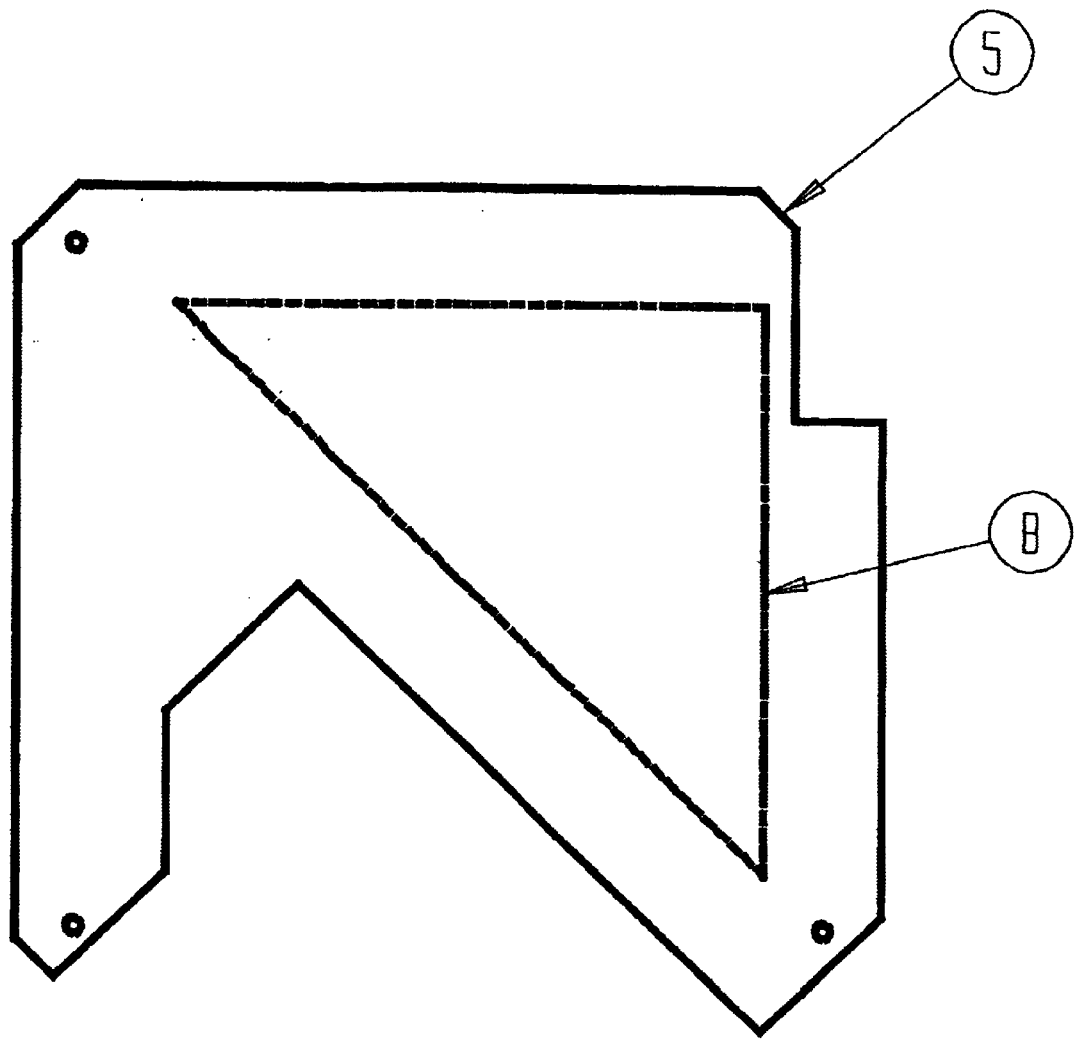
FIG. 6A is a schematic view of a PCB board for an arrow symbol signal.
Figure 6B:
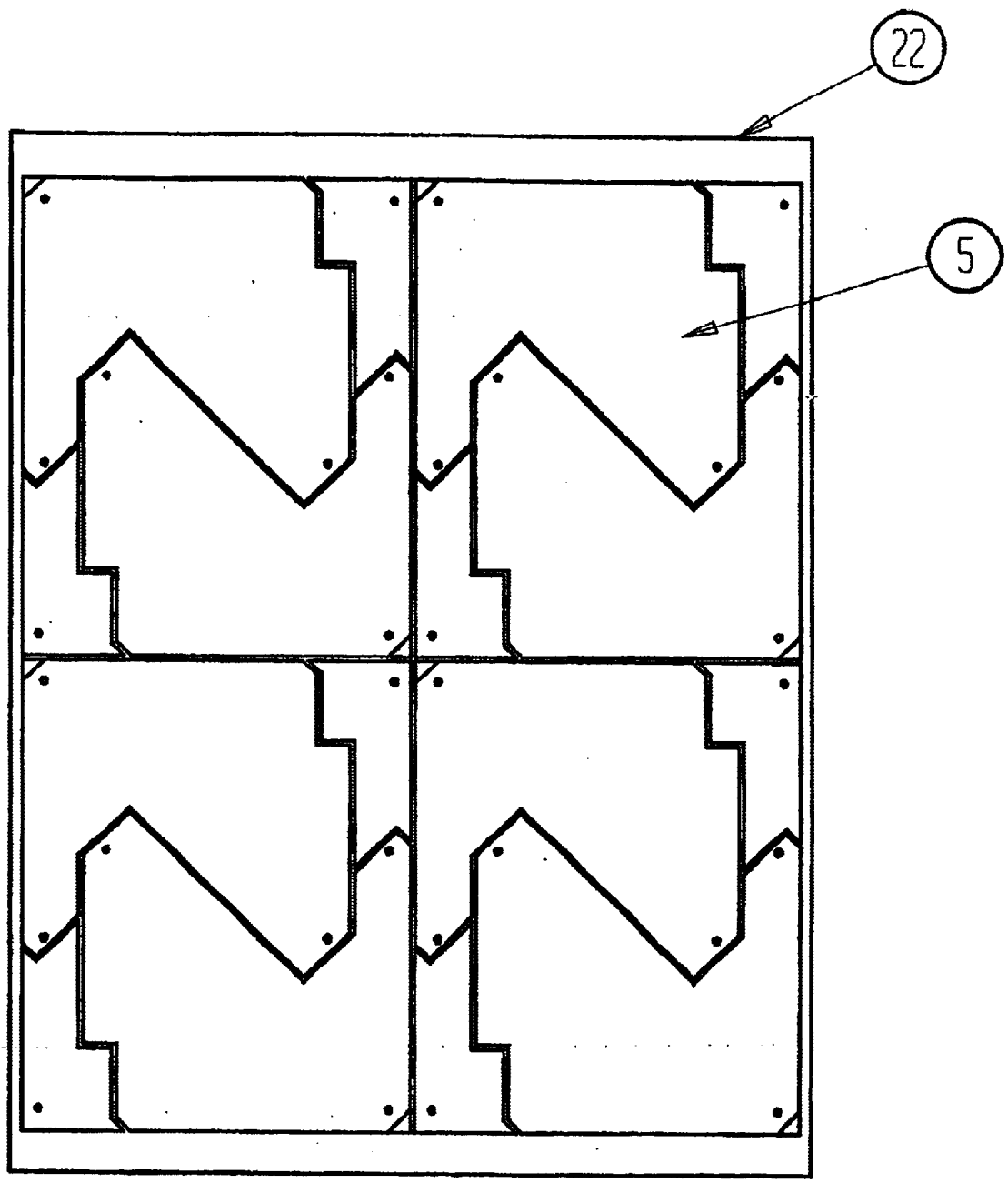
FIG. 6B is a schematic view of a bulk PCB showing the layout thereon of multiple PCB's according to FIG. 6A thereon.

The size of the PCB 5 may be determined by the smallest circle, rectangle or other shape that will encompass the desired LED pattern, thus saving material costs by minimizing the size of the PCB 5. Where arrow symbols are being displayed, the arrow form may be cut from a bulk PCB panel 22 cut out as shown in FIGS. 6A and 6B, minimizing PCB material cost. Power supply and light degradation sensor circuitry may be located on the single PCB 5 in the area B.

Other embodiments of the present invention include but are not limited to pedestrian signals, pedestrian signals with countdown displays, informational signals including emergency exit signs, and any other form of LED symbol signal which would otherwise suffer from the "pixel effect". In the case of pedestrian signals or other large graphical symbols the cover may be omitted and or integrated with the mask, the diffusion surface located, for example on an inner surface of the optical elements 18 or on the signal's external surface.

This invention is entitled to a range of different embodiments and their equivalents, and is to be limited only by the scope of the following claims.

I claim:

1. A LED symbol signal, comprising:
   at least one LED mounted on
   a printed circuit board arranged in
   a housing with an open end; the open end covered by
   a collimating element with at least one optical segment,
   a mask with at least one hole defining the symbol, and
   a cover.
2. The signal of claim 1, wherein:
   a power supply circuit is located on the printed circuit board.
3. The signal of claim 1, wherein:
   the mask has a thickness which substantially fills a space between the collimating element and the cover.
4. The signal of claim 1, wherein:
   an inner face of the cover has a diffusion surface having optical features.
5. The signal of claim 1, wherein:
   an outer face of the cover has a diffusion surface having optical features.
6. The signal of claim 1, wherein:
   an outer face of the collimating element has a diffusion surface having optical features.
7. The signal of claim 1, wherein:
   an inner face of the collimating element has a diffusion surface having optical features.
8. The signal of claim 1, wherein:
   the collimating element is one or more of the optical segment(s) that are attachable to at least one hole in the mask.
9. The signal of claim 1, wherein:
   the collimating element, the mask, and the cover are integrated into a single component.
10. The signal of claim 1, wherein:
    a front surface of the cover is angled with respect to a back plane of the housing.
11. The signal of claim 1, wherein:
    the printed circuit board is shaped to support electrical circuitry and an LED configuration generally corresponding to the symbol but is otherwise cut-away.
12. The signal of claim 1, wherein:
    the at least one LED, the collimating element and the cover are arranged and configured to direct a light output from the at least one LED in a substantially equal angle about a central axis of the housing.
13. The signal of claim 1, wherein:
    the symbol is an arrow.
14. The signal of claim 1, wherein:
    the optical segments are hexagonal in shape.
15. The signal of claim 1, wherein:
    the signal is arranged for placement into an incandescent signal housing upon removal of an incandescent lamp and a lens.
16. The signal of claim 15, wherein:
    the signal connects to an incandescent lamp socket with an incandescent socket power connector.
17. The signal of claim 1, further including:
    at least one reflector mounted on the printed circuit board.
18. The signal of claim 17, wherein:
    the at least one reflector is arranged to redirect light emitted through a side wall of the at east one LED into a forward direction.
19. The signal of claim 4, wherein:
    the diffusion surface is only in an area corresponding with the at least one hole in the mask.
20. The signal of claim 4, wherein:
    a diameter of the optical features is less than a diameter of the at least one optical segment.
21. The signal of claim 1, wherein:
    the at least one LED and the optical segment(s) are aligned so that a majority of light emitted by the at least one LED is directed onto the at least one optical segment.
22. The signal of claim 21, wherein:
    the at least one LED is a plurality of LEDs, and the at least one optical segment is a plurality of optical segments, each of the LEDs having only one of the plurality of optical segments associated with it the LED.
23. The signal of claim 22, wherein:
    more than one of the LEDs are clustered together and are associated with only one of the plurality of optical segments.
24. The signal of claim 5, wherein:
    a diameter of the optical features is less than a diameter of the at least one optical segment.
25. The signal of claim 6, wherein:
    a diameter of the optical features is less than a diameter of the at least one optical segment.
26. The signal of claim 7, wherein:
    a diameter of the optical features is less than a diameter of the at least one optical segment.
27. A LED symbol signal, comprising:
    at least one LED mounted in at least one reflector, on
    a printed circuit board having power supply components thereon, arranged in
    a housing with an open end, the open end covered by
    a collimating element with a plurality of optical segments,
    a mask having at least one hole defining the symbol, and
    a cover having a diffusion surface in areas corresponding to the at least one hole, which closes the housing.
28. A LED symbol signal, comprising:
    at least one LED mounted on
    a printed circuit board arranged in a housing with an open end, the open end covered by a collimating element with at least one optical segment arranged to direct a light output from the at least one LED, a mask with at least one hole defining the symbol, and a cover having an inner face with a diffusion surface, the cover sealing the open end of the housing; and the mask has a thickness which substantially fills a space between the collimating element and the cover.

29. A LED symbol signal, comprising:

at least one LED mounted on a printed circuit board arranged in a housing with an open end, the open end covered by a cover comprising a plurality of optical segments on an LED side and a mask on the opposite side; said, mask corresponding to the symbol.

30. The LED symbol signal of claim 29, wherein:

the optical segments are generally hexagonal.

31. The LED symbol signal of claim 30, wherein:

the cover has a diffusion surface with optical features having a diameter that is less than a diameter of the optical segments.

32. The LED symbol signal of claim 29, wherein:

a power supply circuit is located on the printed circuit board.

\* \* \* \* \*